(12) United States Patent
Haratipour et al.

(10) Patent No.: US 11,450,750 B2
(45) Date of Patent: Sep. 20, 2022

(54) THIN-FILM TRANSISTORS WITH VERTICAL CHANNELS

(71) Applicant: Intel Corporation, Santa Clara, CA (US)

(72) Inventors: Nazila Haratipour, Hillsboro, OR (US); Tahir Ghani, Portland, OR (US); Jack T. Kavalieros, Portland, OR (US); Gilbert Dewey, Beaverton, OR (US); Benjamin Chu-Kung, Portland, OR (US); Seung Hoon Sung, Portland, OR (US); Van H. Le, Portland, OR (US); Shriram Shivaraman, Hillsboro, OR (US); Abhishek Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 845 days.

(21) Appl. No.: 16/146,654

(22) Filed: Sep. 28, 2018

(65) Prior Publication Data
US 2020/0105892 A1 Apr. 2, 2020

(51) Int. Cl.
*H01L 23/532* (2006.01)
*H01L 29/51* (2006.01)
(Continued)

(52) U.S. Cl.
CPC .... *H01L 29/42372* (2013.01); *H01L 23/5329* (2013.01); *H01L 27/10* (2013.01); *H01L 27/105* (2013.01); *H01L 29/41733* (2013.01); *H01L 29/42384* (2013.01); *H01L 29/517* (2013.01); *H01L 29/66553* (2013.01);
(Continued)

(58) Field of Classification Search
CPC ... H01L 23/5329; H01L 27/10; H01L 27/105; H01L 21/8221; H01L 27/0688; H01L 27/1207; H01L 29/41733; H01L 29/42384; H01L 29/517; H01L 29/66553; H01L 29/66742; H01L 29/7869; H01L 29/78696; H01L 29/66969; H01L 27/10826;
(Continued)

(56) References Cited

U.S. PATENT DOCUMENTS 9,245,885 B1 * 1/2016 Xie .................. H01L 29/78642
10,475,889 B1 * 11/2019 Li ....................... H01L 29/0847
(Continued)

*Primary Examiner* — Galina G Yushina
(74) *Attorney, Agent, or Firm* — Schwabe, Williamson & Wyatt P.C.

(57) ABSTRACT

Embodiments herein describe techniques for a thin-film transistor (TFT). The transistor includes a source electrode oriented in a horizontal direction, and a channel layer in contact with a portion of the source electrode and oriented in a vertical direction substantially orthogonal to the horizontal direction. A gate dielectric layer conformingly covers a top surface of the source electrode and surfaces of the channel layer. A gate electrode conformingly covers a portion of the gate dielectric layer. A drain electrode is above the channel layer, oriented in the horizontal direction. A current path is to include a current portion from the source electrode along a gated region of the channel layer under the gate electrode in the vertical direction, and a current portion along an ungated region of the channel layer in the horizontal direction from the gate electrode to the drain electrode. Other embodiments may be described and/or claimed.

14 Claims, 9 Drawing Sheets

(51) Int. Cl.
*H01L 29/786* (2006.01)
*H01L 29/66* (2006.01)
*H01L 29/423* (2006.01)
*H01L 29/417* (2006.01)
*H01L 27/10* (2006.01)
*H01L 27/105* (2006.01)

(52) U.S. Cl.
CPC .... *H01L 29/66742* (2013.01); *H01L 29/7869* (2013.01); *H01L 29/78642* (2013.01); *H01L 29/78696* (2013.01)

(58) Field of Classification Search
CPC ......... H01L 27/10879; H01L 29/41791; H01L 29/66795; H01L 2029/7858
See application file for complete search history.

(56) References Cited

U.S. PATENT DOCUMENTS

| | | | | |
|---|---|---|---|---|
| 2011/0254067 | A1* | 10/2011 | Abbott | H01L 21/28132 |
| | | | | 257/296 |
| 2018/0197788 | A1* | 7/2018 | Anderson | H01L 29/7827 |
| 2018/0331212 | A1* | 11/2018 | Zang | H01L 29/7827 |
| 2019/0385914 | A1* | 12/2019 | Wu | H01L 29/1037 |

* cited by examiner

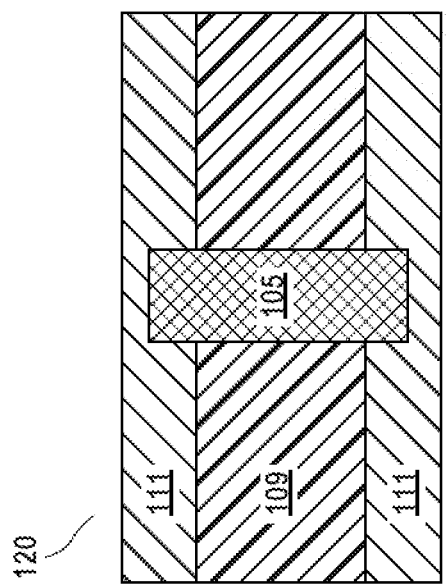
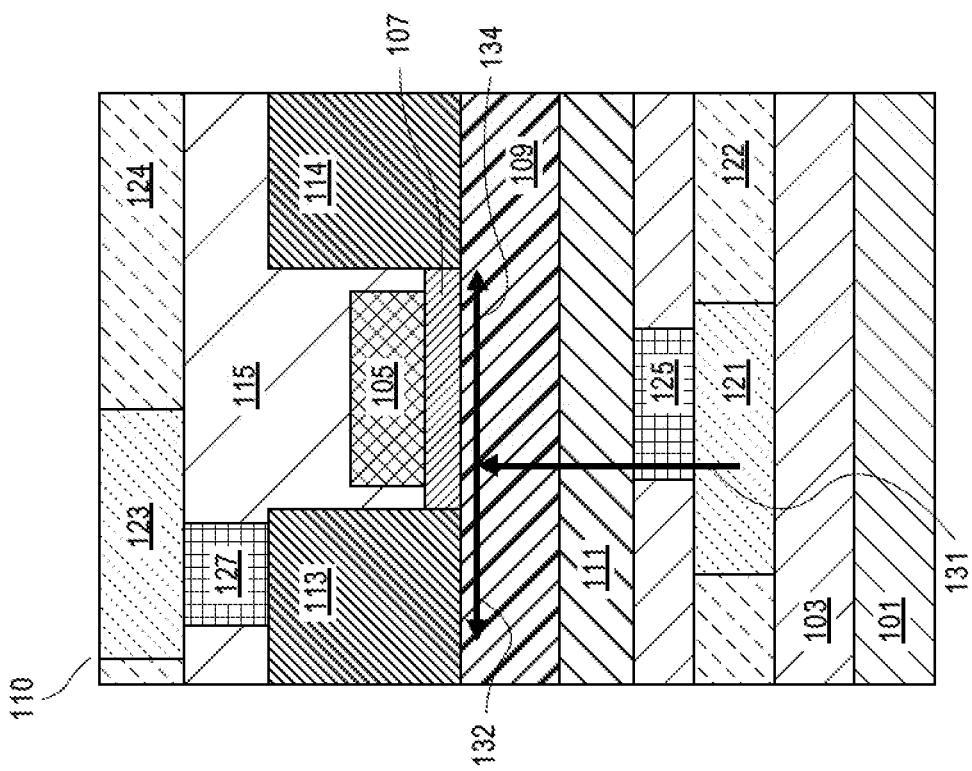
Figure 1(d)
Figure 1(c)

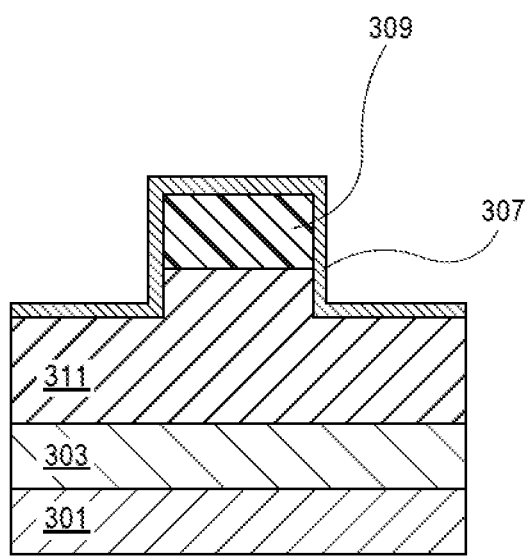
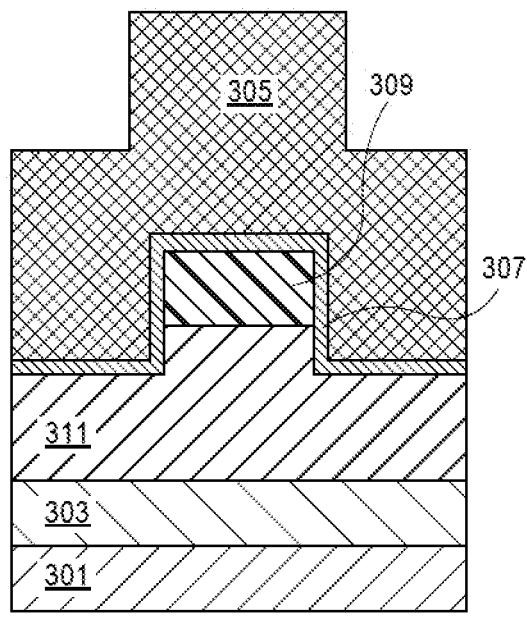
Figure 3(a)
Figure 3(b)
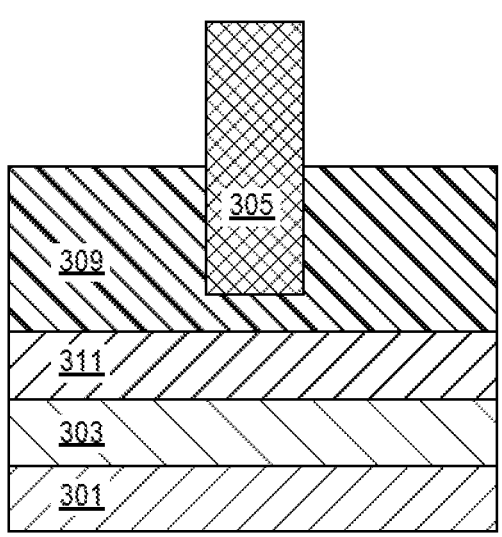
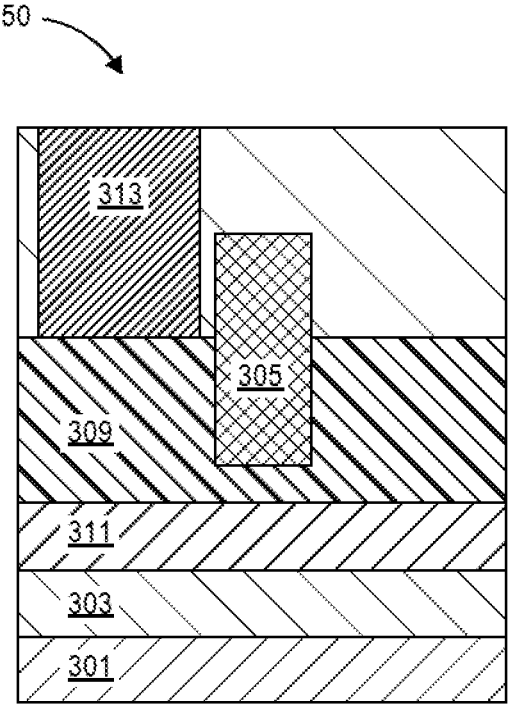
Figure 3(c)
Figure 3(d)

THIN-FILM TRANSISTORS WITH VERTICAL CHANNELS

FIELD

Embodiments of the present disclosure generally relate to the field of integrated circuits, and more particularly, to transistors.

BACKGROUND

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the backend, while leaving the silicon substrate areas for high-speed transistors. TFTs hold great potential for large area and flexible electronics, e.g., displays. Other applications of TFTs may include memory arrays. However, TFTs may have large contact resistances for the contact electrodes, e.g., source electrodes or drain electrodes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 1(a)-1(d) schematically illustrate diagrams in three-dimensional views or cross-section views of a thin-film transistor (TFT) having a channel layer oriented in a vertical direction, in accordance with some embodiments.

FIGS. 3(a)-3(d) illustrate a process for forming a TFT having a channel layer oriented in a vertical direction, in accordance with some embodiments.

DETAILED DESCRIPTION

Figure 1A:
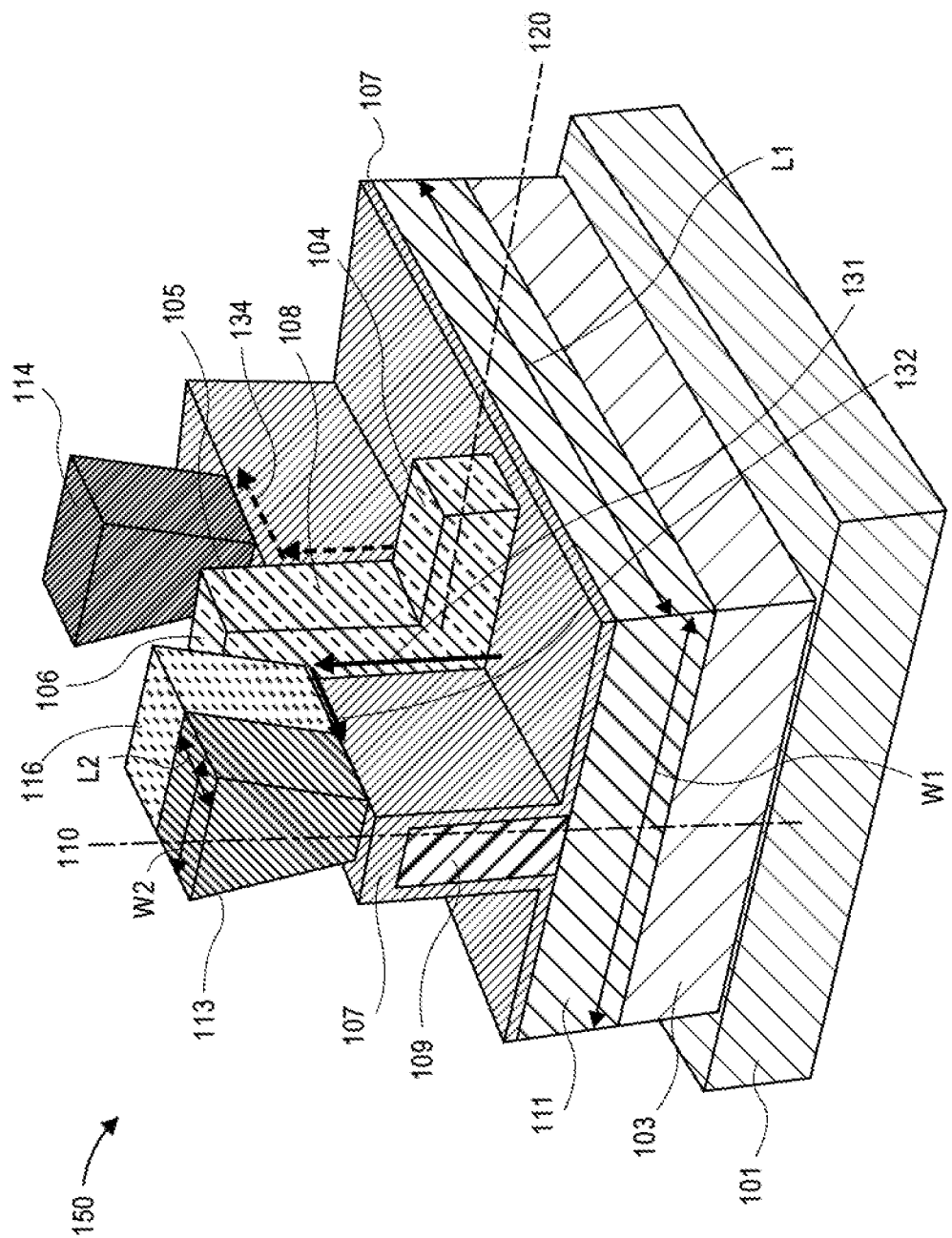

Thin-film transistors (TFT) have emerged as an attractive option to fuel Moore's law by integrating TFTs in the backend. TFTs may be fabricated in various architectures, e.g., a back-gated or bottom gate architecture, or a top-gate architecture. However, TFTs may typically have high contact resistances for the contact electrodes, e.g., source electrodes or drain electrodes. Common methods to lower the contact resistances for the contact electrodes may rely on the creation of oxygen vacancies, which may come at the expense of short channel degradation due to lateral straggle of the TFTs.

Embodiments herein may present a TFT having a channel layer oriented in a vertical direction, which may have lower resistances without compromising short channel performance. A TFT may have a source electrode and a drain electrode oriented in a horizontal direction, while having a channel layer oriented in a vertical direction substantially orthogonal to the horizontal direction. The vertical channel layer may allow a gate length of the TFT to be scaled independently from the lithography techniques used in making the TFT. The source electrode and the drain electrode of the TFT may be asymmetric contact electrodes to reduce the contact resistances of the contact electrodes. As a result, the power consumption of the TFTs may be reduced.

Embodiments herein may present a semiconductor device. The semiconductor device includes a substrate oriented in a horizontal direction and a transistor above the substrate. The transistor includes a source electrode above the substrate and oriented in the horizontal direction. The transistor further includes a channel layer including a channel material above and in contact with a portion of the source electrode, the channel layer oriented in a vertical direction substantially orthogonal to the horizontal direction. A gate dielectric layer is above the source electrode and the channel layer, conformingly covering a top surface of the source electrode and surfaces of the channel layer. In addition, a gate electrode is above a portion of the channel layer, conformingly covering a portion of the gate dielectric layer, and separated from the channel layer by the gate dielectric layer. Moreover, a drain electrode is above and in contact with the channel layer, oriented in the horizontal direction. A current path is to include a vertical current portion from the source electrode along a gated region of the channel layer under the gate electrode in the vertical direction, and a horizontal current portion along an ungated region of the channel layer in the horizontal direction from the gate electrode to the drain electrode.

Embodiments herein may present a method for forming a TFT. The method may include forming a source electrode above a substrate and oriented in a horizontal direction, where the substrate is oriented in the horizontal direction. The method further includes forming a channel layer including a channel material above and in contact with a portion of the source electrode, the channel layer oriented in a vertical direction substantially orthogonal to the horizontal direction. In addition, the method includes forming a gate dielectric layer above the source electrode and the channel layer, conformingly covering a top surface of the source electrode and surfaces of the channel layer. Moreover, the method includes forming a gate electrode above a portion of the channel layer, conformingly covering a portion of the gate dielectric layer, and separated from the channel layer by the gate dielectric layer. Furthermore, the method includes forming a drain electrode above and in contact with the channel layer, oriented in the horizontal direction. A current path of the TFT is to include a vertical current portion from the source electrode along a gated region of the channel layer under the gate electrode in the vertical direction, and a horizontal current portion along an ungated region of the channel layer in the horizontal direction from the gate electrode to the drain electrode.

Embodiments herein may present a computing device, which may include a circuit board, and a memory device coupled to the circuit board and including a memory array.

In more detail, the memory array may include a plurality of memory cells. A memory cell of the plurality of memory cells may include a transistor and a storage cell. The transistor in the memory cell may include a gate electrode coupled to a word line of the memory array, a source electrode coupled to a bit line of the memory array, and a drain electrode coupled to a first electrode of the storage cell. The storage cell further includes a second electrode coupled to a source line of the memory array. The source electrode is above a substrate and oriented in a horizontal direction, where the substrate is oriented in the horizontal direction. A channel layer including a channel material is above and in contact with a portion of the source electrode, and the channel layer is oriented in a vertical direction substantially orthogonal to the horizontal direction. A gate dielectric layer is above the source electrode and the channel layer, conformingly covering a top surface of the source electrode and surfaces of the channel layer. The gate electrode is above a portion of the channel layer, conformingly covering a portion of the gate dielectric layer, and separated from the channel layer by the gate dielectric layer. The drain electrode is above and in contact with the channel layer and oriented in the horizontal direction. A current path is to include a vertical current portion from the source electrode along a gated region of the channel layer under the gate electrode in the vertical direction, and a horizontal current portion along an ungated region of the channel layer in the horizontal direction from the gate electrode to the drain electrode.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, silicon oxynitride, aluminum oxide, hafnium oxide, and titanium oxide. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. Or the source and drain regions can be doped using different plasmas. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIGS. 1(a)-1(d) schematically illustrate diagrams in three-dimensional views or cross-section views of a TFT 150 having a channel layer 109 oriented in a vertical direction, in accordance with some embodiments. For clarity, features of the TFT 150 and the channel layer 109 may be described below as examples for understanding an example TFT having a channel layer oriented in a vertical direction. It is to be understood that there may be more or fewer components within a TFT and a channel layer. Further, it is to be understood that one or more of the components within a TFT and a channel layer, may include additional and/or varying features from the description below, and may include any device that one having ordinary skill in the art would consider and/or refer to as a TFT and a channel layer.

Figure 1B:
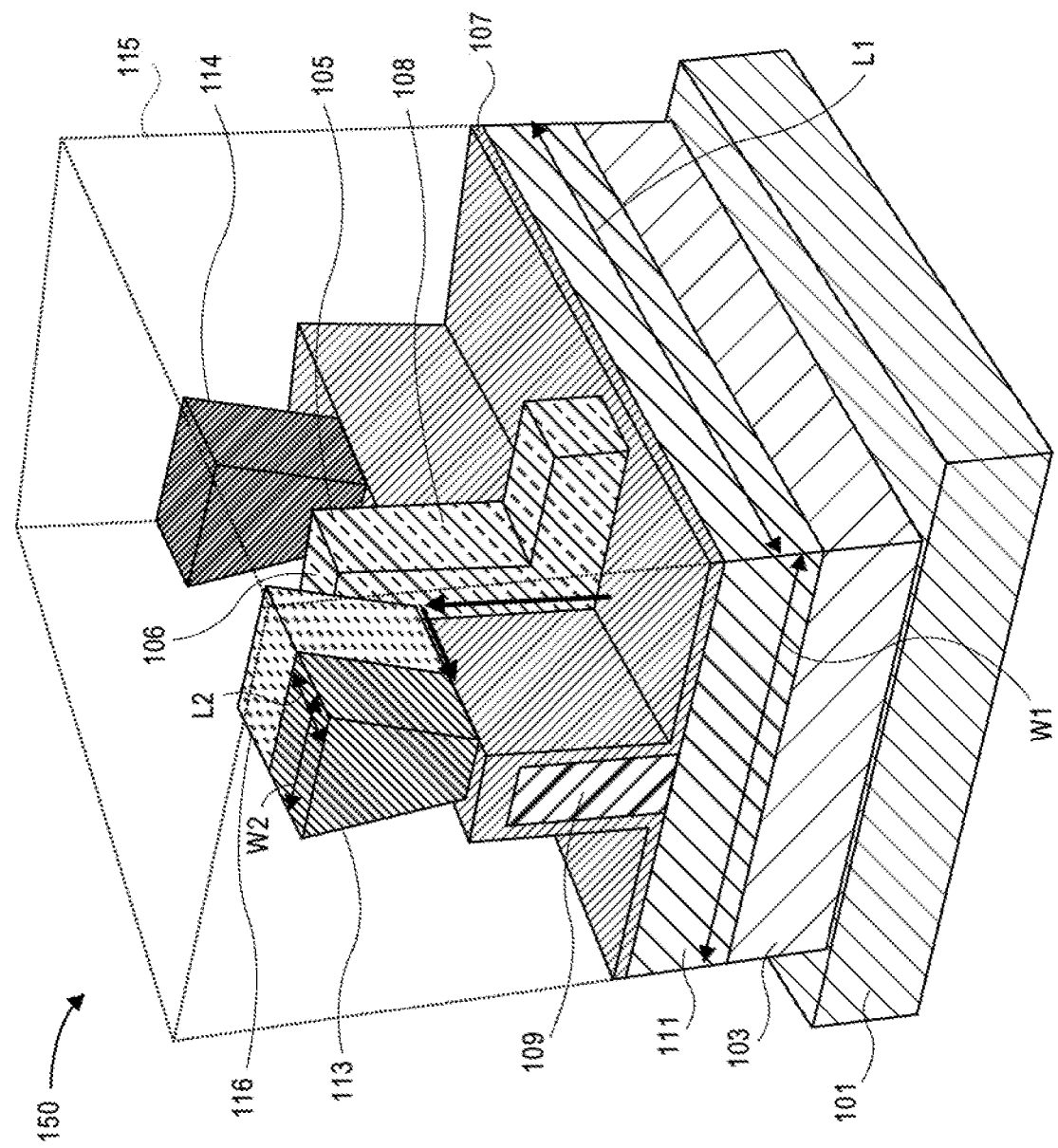

In embodiments, as shown in FIG. 1(a), a semiconductor device includes a substrate 101, an ILD layer 103 above the substrate 101, and the TFT 150 above the substrate 101 and the ILD layer 103. The TFT 150 includes a gate electrode 105 above the substrate 101, a gate dielectric layer 107, a channel layer 109, a source electrode 111, a drain electrode 113, and another drain electrode 114. The source electrode 111 and the drain electrode 113 or the drain electrode 114 may be interchangeable. A spacer 116 is between the drain electrode 113 and the gate electrode 105 to separate the drain electrode 113 from the gate electrode 105. The gate electrode 105, the gate dielectric layer 107, the channel layer 109, the source electrode 111, the drain electrode 113, and the drain electrode 114 are within the ILD layer 115 above the substrate 101, as shown in FIG. 1(b). Additionally and alternatively, the gate electrode 105 and the drain electrode 113 may be separated by the ILD layer 115 without the spacer 116.

In embodiments, the substrate 101 is oriented in a horizontal direction, while the source electrode 111 is above the substrate 101 and also oriented in the horizontal direction, hence in parallel to the substrate 101. The channel layer 109 is above and in contact with a portion of the source electrode 111, and the channel layer 109 is oriented in a vertical direction substantially orthogonal to the horizontal direction. In detail, the channel layer 109 oriented in the vertical direction may mean that the channel layer 109 is oriented in a vertical direction substantially perpendicular or orthogonal to the plane defined by the substrate 101 that is oriented in the horizontal direction. A first direction may be substantially perpendicular or orthogonal to a second direction when there is +/−10 degrees of orthogonality between the two directions. For example, the substrate 101 may be in the horizontal direction, while the channel layer 109 may be oriented in a vertical direction above the substrate 101 when the channel layer 109 may form 80 degree or 100 degree with the horizontal direction.

In embodiments, the channel layer 109 may be of various shapes or sizes. For example, as shown in FIG. 1(a), the channel layer 109 is of a rectangular prism shape, including a top surface and sidewalls coupled to the top surface. The top surface of the channel layer 109 is in parallel to the substrate 101 and the source electrode 111, while the sidewalls of the channel layer 109 are coupled to the top surface and are in the vertical direction substantially orthogonal to the horizontal direction. In some other embodiments, a cross-section of the channel layer 109 may be of a rectangular shape, a circular shape, a triangular shape, a square shape, and a polygon shape.

In embodiments, the channel layer 109 is in contact with a portion of the source electrode 111, while other portions of the source electrode 111 are not covered by the channel layer 109. The gate dielectric layer 107 includes a gate dielectric material, and is above the source electrode 111 and the channel layer 109. Furthermore, the gate dielectric layer 107 conformingly covers a top surface of the source electrode 111 that is not covered by the channel layer 109. In addition, the gate dielectric layer 107 conformingly covers surfaces of the channel layer 109. When the channel layer 109 is of a rectangular prism shape, including a top surface and sidewalls coupled to the top surface, the gate dielectric layer 107 conformingly covers the top surface and sidewalls of the channel layer 109.

In embodiments, the gate electrode 105 is above a portion of the channel layer 109, conformingly covering a portion of the gate dielectric layer 107, and separated from the channel layer 109 by the gate dielectric layer 107. When the channel layer 109 is of a rectangular prism shape, including a top surface and sidewalls coupled to the top surface, the gate electrode 105 includes a horizontal portion 106 above the top surface of the channel layer 109, and two vertical portions 108 along sidewalls of the channel layer 109. Furthermore, the gate electrode 105 may include a portion 104 above the gate dielectric layer 107, where the portion 104 is not overlapped with the channel layer 109. The gate electrode 105 including the horizontal portion 106, the vertical portions 108, and the portion 104 may extend in a direction orthogonal to the channel layer 109. A cross-section view of the TFT 150 along a line 110 cross a center of the gate electrode 105 and the channel layer 109 is shown in FIG. 1(c). In addition, a cross-section view of the TFT 150 along a line 120 cross the gate electrode 105 and the channel layer 109 is shown in FIG. 1(d).

In embodiments, as shown in FIG. 1(c), the source electrode 111 is above the substrate 101 and the ILD 103. The channel layer 109 is above and in contact with a portion of the source electrode 111. The gate electrode 105 is above a portion of the channel layer 109, and separated from the channel layer 109 by the gate dielectric layer 107. The drain electrode 113 is above and in contact with the channel layer 109 and oriented in the horizontal direction. In addition, the source electrode 111 may be coupled to a first metal electrode 121 located in a first metal layer 122, the drain electrode 113 may be coupled to a second metal electrode 123 located in a second metal layer 124, and the second metal layer 124 is separated from the first metal layer 122 by the ILD layer 115. In some embodiments, the source electrode 111 may be coupled by a first short via 125 to the first metal electrode 121 located in the first metal layer 122. Additionally and alternatively, the drain electrode 113 may be coupled by a second short via 127 to the second metal electrode 123 located in the second metal layer 124. The gate electrode 105, the channel layer 109, the source electrode 111, and the drain electrode 113 are within the ILD layer 115 above the substrate 101.

In embodiments, a current path is to include a vertical current portion 131 from the source electrode 111 along a gated region of the channel layer 109 under the gate electrode 105 in the vertical direction, and a horizontal current portion 132 along an ungated region of the channel layer 109 in the horizontal direction from the gate electrode 105 to the drain electrode 113. The channel layer 109 is vertically above the substrate 101, which may appear to be similar to a fin structure in a FinFET transistor. However, the channel layer 109 differs from a fin structure in a FinFET transistor in many ways. For example, a FinFET transistor is located above a substrate and a current path in a FinFET transistor may only flow from a source electrode to a drain electrode in a horizontal direction, different from the current path including the vertical current portion 131 and the horizontal current portion 132 for the TFT 150 as shown in FIG. 1(a)-1(c). In addition, for the TFT 150, the source electrode 111 may be above the first metal electrode 121 located in the first metal layer 122, the drain electrode 113 may be above the first metal layer 122 as well. On the other hand, a FinFET transistor may not have a source electrode or a drain electrode above a metal layer. Moreover, the channel layer 109 may be normally off at zero bias, so that there is no current path flowing vertically from the source electrode 111 to the drain electrode 113 without going through the gated region under the gate electrode 105. Instead, the vertical current portion 131 is from the source electrode 111 along a gated region of the channel layer 109 under the gate electrode 105 when the gate electrode 105 is on.

In embodiments, additionally and alternatively, the drain electrode 113 is a first drain electrode, and the TFT 150 further optionally includes a second drain electrode, e.g., the drain electrode 114 above and in contact with the channel layer 109. The drain electrode 114 may be oriented in the horizontal direction as well. When the TFT 150 includes the drain electrode 114, the current path is to include the vertical current portion 131 from the source electrode 111 along the gated region of the channel layer 109 under the gate electrode 105 in the vertical direction, a first horizontal current portion 132 along a first ungated region of the channel layer 109 in the horizontal direction from the gate electrode 105 to the first drain electrode 113, and a second horizontal current portion 134 along a second ungated region of the channel layer 109 in the horizontal direction from the gate electrode 105 to the second drain electrode 114.

In embodiments, the source electrode 111 or the drain electrode 113 may be asymmetric contact electrodes, which may further reduce the resistances of the contact electrodes. For example, the source electrode 111 may be of a rectangular shape with a length L1 and a width W1, and the drain electrode 113 may be of a rectangular shape with a length L2 and a width W2. In embodiments, the length L1 may be different from the length L2, or the width W1 may be different from the width W2. The length and the width of the source electrode 111 or the drain electrode 113 may be tailored to the thickness of the TFT channel layer 109. Furthermore, the source electrode 111 may include a first conductive material, and the drain electrode 113 may include a second conductive material different from the first conductive material of the source electrode 111.

In embodiments, the source electrode 111 or the drain electrode 113 may be a stack including multiple layers. For example, the source electrode 111 includes a metal layer, and a metal sealant layer adjacent to the metal layer. The source electrode 111, or the drain electrode 113 may include titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al, Ni, Cu, Cr, Ru, TiAlN, HfAlN, or InAlO. Similarly, the gate electrode 105 may include a conductive material similar to the conductive material for the source electrode 111 or the drain electrode 113.

In embodiments, the channel layer 109 may be a n-type doped channel or a p-type doped channel. The channel layer 109 may include a material such as: $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103 or the ILD layer 115 may include silicon dioxide ($SiO_2$), carbon doped oxide (CDO), silicon nitride, $O_3$-tetraethylorthosilicate (TEOS), $O_3$-hexamethyldisiloxane (HMDS), plasma-TEOS oxide layer, perfluorocyclobutane, polytetrafluoroethylene, fluorosilicate glass (FSG), organic polymer, silsesquioxane, siloxane, organosilicate glass, or other suitable materials.

In embodiments, the gate dielectric layer 107 may include a high-K dielectric material selected from the group consisting of hafnium silicate, zirconium silicate, hafnium dioxide, zirconium dioxide, aluminum oxide, and nitride hafnium silicate.

Figure 2:
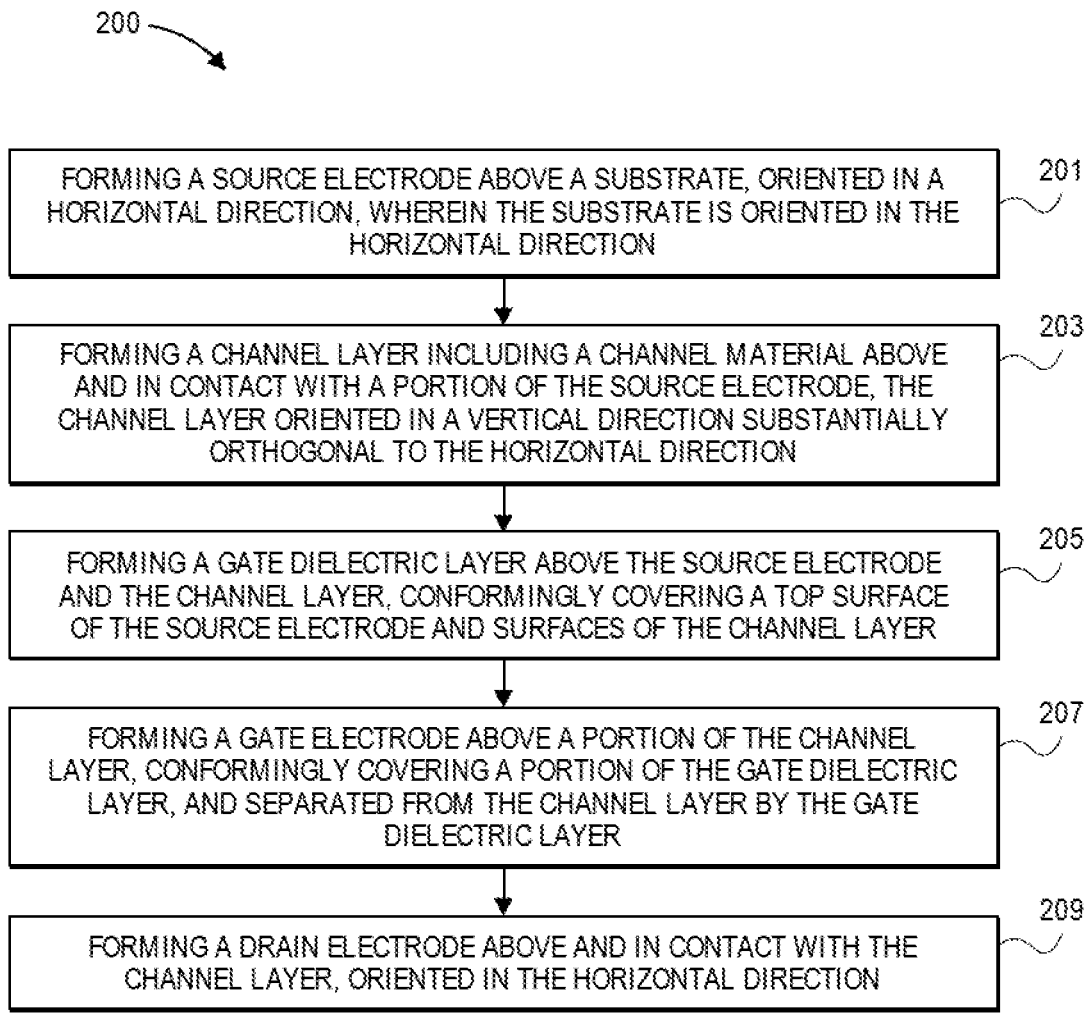
FIG. 2 illustrates a process for forming a TFT having a channel layer oriented in a vertical direction, in accordance with some embodiments.

FIG. 2 illustrates a process 200 for forming a TFT having a channel layer oriented in a vertical direction, in accordance with some embodiments. More details of the process 200 are illustrated in FIGS. 3(a)-3(d). In embodiments, the process 200 may be applied to form the TFT 150 having the channel layer 109 oriented in a vertical direction, as shown in FIGS. 1(a)-1(d).

At block 201, the process 200 may include forming a source electrode above a substrate, oriented in a horizontal direction, wherein the substrate is oriented in the horizontal direction. For example, as shown in FIG. 3(a), the process 200 may include forming a source electrode 311 above a substrate 301 and an ILD layer 303, oriented in a horizontal direction, wherein the substrate 301 is oriented in the horizontal direction.

At block 203, the process 200 may include forming a channel layer including a channel material above and in contact with a portion of the source electrode, the channel layer oriented in a vertical direction substantially orthogonal to the horizontal direction. For example, as shown in FIG. 3(a), the process 200 may include forming a channel layer 309 including a channel material above and in contact with a portion of the source electrode 311, the channel layer 309 oriented in a vertical direction substantially orthogonal to the horizontal direction.

At block 205, the process 200 may include forming a gate dielectric layer above the source electrode and the channel layer, conformingly covering a top surface of the source electrode and surfaces of the channel layer. For example, as shown in FIG. 3(a), the process 200 may include forming a gate dielectric layer 307 above the source electrode 311 and the channel layer 309, conformingly covering a top surface of the source electrode 311 and surfaces of the channel layer 309.

At block 207, the process 200 may include forming a gate electrode above a portion of the channel layer, conformingly covering a portion of the gate dielectric layer, and separated from the channel layer by the gate dielectric layer. For example, as shown in FIGS. 3(b)-3(c) in different cross-section views, the process 200 may include forming a gate electrode 305 above a portion of the channel layer 309, conformingly covering a portion of the gate dielectric layer 307, and separated from the channel layer 309 by the gate dielectric layer 307.

At block 209, the process 200 may include forming a drain electrode above and in contact with the channel layer, oriented in the horizontal direction. For example, as shown in FIG. 3(d), the process 200 may include forming a drain electrode 313 above and in contact with the channel layer 309, oriented in the horizontal direction. As a result of the process 200, a TFT 350 may be formed as shown in FIG. 3(d).

In addition, the process 200 may include additional operations to form other layers, e.g., ILD layers, a spacer, encapsulation layers, insulation layers, not shown.

Figure 4:
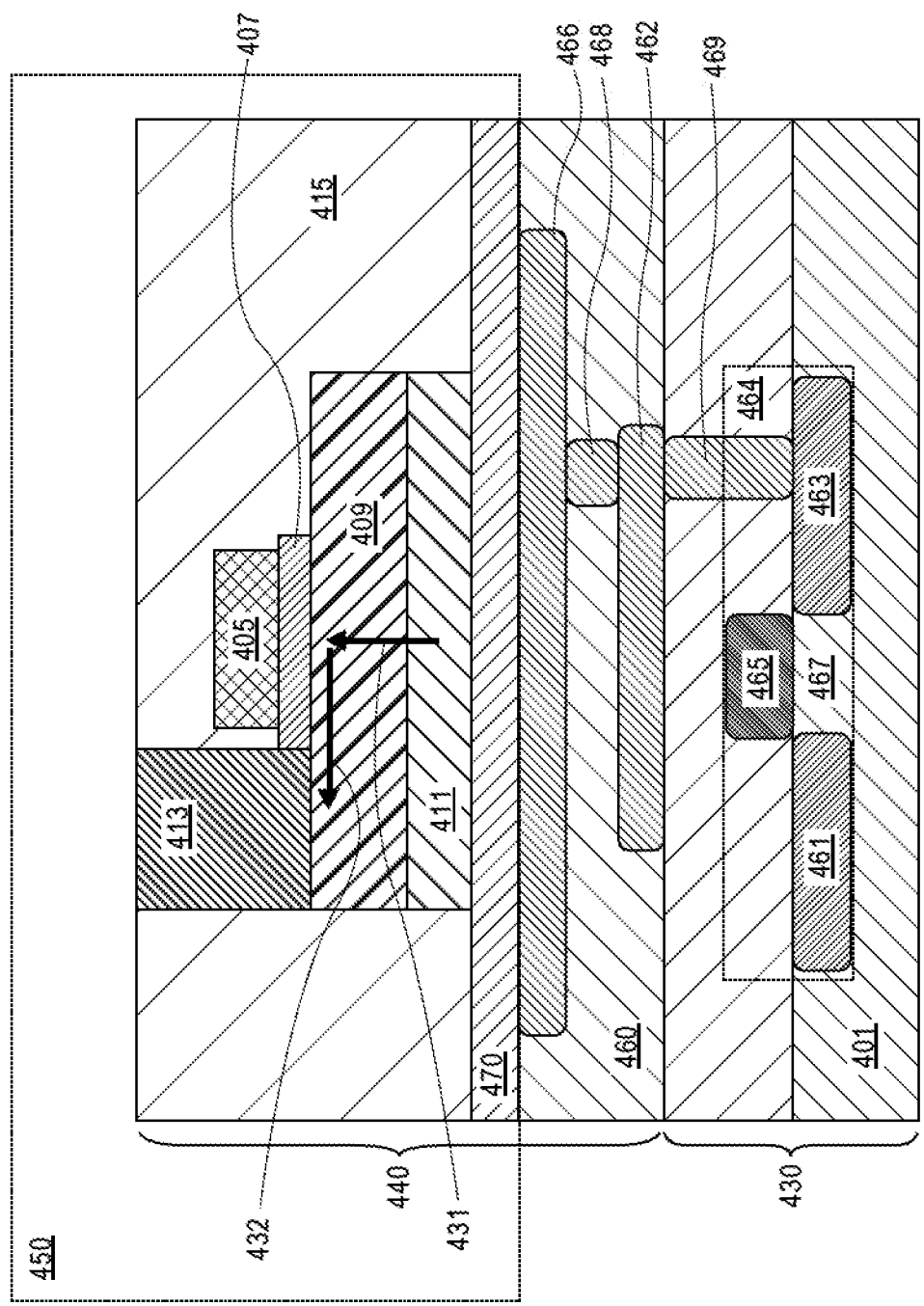
FIG. 4 schematically illustrates a diagram of a TFT having a channel layer oriented in a vertical direction and formed in back-end-of-line (BEOL) on a substrate, in accordance with some embodiments.

FIG. 4 schematically illustrates a diagram of a TFT 450 having a channel layer 409 oriented in a vertical direction and formed in back-end-of-line (BEOL) on a substrate, in accordance with some embodiments. The vertical TFT 450 may be an example of the TFT 150 in FIGS. 1(a)-1(d). Various layers in the vertical TFT 450 may be similar to corresponding layers in the TFT 150 in FIGS. 1(a)-1(d).

In embodiments, a semiconductor device includes the substrate 401, and the TFT 450 above a substrate 401. The TFT 450 includes a gate electrode 405 above the substrate 401, a gate dielectric layer 407, a channel layer 409, a source electrode 411, and a drain electrode 413. The substrate 401 is oriented in a horizontal direction, while the source electrode 411 is above the substrate 401 and also oriented in the horizontal direction, hence in parallel to the substrate 401. The channel layer 409 is above and in contact with a portion of the source electrode 411, and the channel layer 409 is oriented in a vertical direction substantially orthogonal to the horizontal direction. The channel layer 409 is in contact with a portion of the source electrode 411, while other portions of the source electrode 411 are not covered by the channel layer 409. The gate dielectric layer 407 includes a gate dielectric material, and is above the source electrode 411 and the channel layer 409. Furthermore, the gate dielectric layer 407 conformingly covers a top surface of the source electrode 411 that is not covered by the channel layer 409. In addition, the gate dielectric layer 407 conformingly covers surfaces of the channel layer 409. When the channel layer 409 is of a rectangular prism shape, including a top surface and sidewalls coupled to the top surface, the gate dielectric layer 407 conformingly covers the top surface and sidewalls of the channel layer 409. The gate electrode 405 is above a portion of the channel layer 409, conformingly covering a portion of the gate dielectric layer 407, and separated from the channel layer 409 by the gate dielectric layer 407. The source electrode 411 may be coupled to a first metal electrode located in a first metal layer, and the drain electrode may be coupled to a second metal electrode located in a second metal layer, and the second metal layer is separated from the first metal layer by the ILD layer 415.

In embodiments, a current path is to include a vertical current portion 431 from the source electrode 411 along a gated region of the channel layer 409 under the gate electrode 405 in the vertical direction, and a horizontal current portion 432 along an ungated region of the channel layer 409 in the horizontal direction from the gate electrode 405 to the drain electrode 413.

In embodiments, the TFT 450 may be formed at the BEOL 440. In addition to the TFT 450, the BEOL 440 may further include a dielectric layer 460 and a dielectric layer 470. One or more vias, e.g., a via 468, may be connected to one or more interconnect, e.g., an interconnect 466, and an interconnect 462 within the dielectric layer 460. In embodiments, the interconnect 466 and the interconnect 462 may be of different metal layers at the BEOL 440. The dielectric layer 460 is shown for example only. Although not shown by FIG. 4, in various embodiments there may be multiple dielectric layers included in the BEOL 440.

In embodiments, the BEOL 440 may be formed on the front-end-of-line (FEOL) 430. The FEOL 430 may include the substrate 401. In addition, the FEOL 430 may include other devices, e.g., a transistor 464. In embodiments, the transistor 464 may be a FEOL transistor, including a source 461, a drain 463, and a gate 465, with a channel 467 between the source 461 and the drain 463 under the gate 465. Furthermore, the transistor 464 may be coupled to interconnects, e.g., the interconnect 462, through a via 469.

Figure 5:
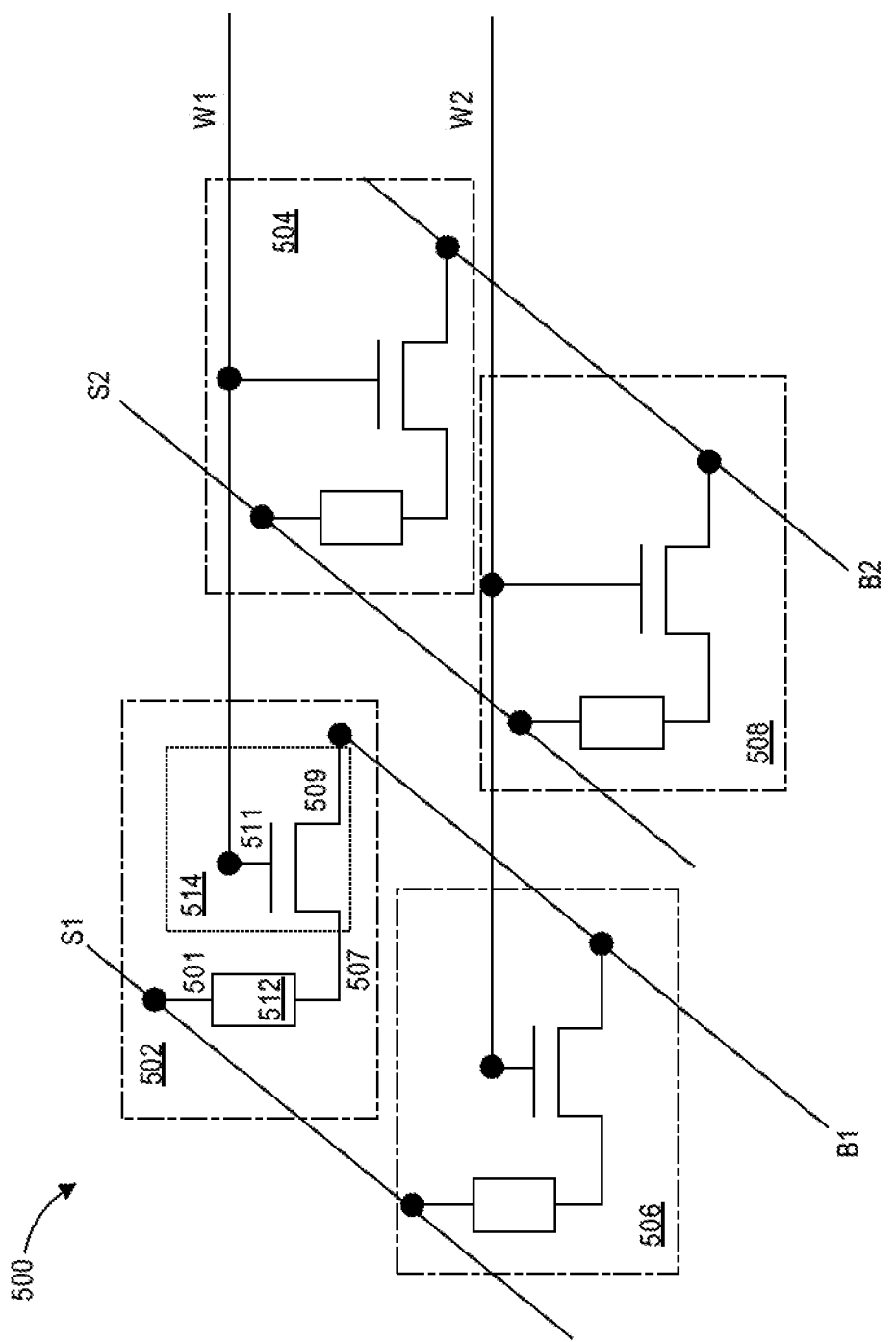
FIG. 5 schematically illustrates a memory array with multiple memory cells, where a TFT may be a selector of a memory cell, in accordance with some embodiments.

FIG. 5 schematically illustrates a memory array 500 with multiple memory cells (e.g., a memory cell 502, a memory cell 504, a memory cell 506, and a memory cell 508), where a TFT, e.g., a TFT 514, may be a selector of a memory cell, e.g., the memory cell 502, in accordance with various embodiments. In embodiments, the TFT 514 may be an example of the TFT 150 in FIGS. 1(a)-1(d), the TFT 450 in FIG. 4, or a TFT formed following the process 200 shown in FIG. 2. The TFT 514 may include a gate electrode 511 coupled to a word line W1.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 502 may be coupled in series with the other memory cells of the same row, and may be coupled in parallel with the memory cells of the other rows. The memory array 500 may include any suitable number of one or more memory cells.

In embodiments, multiple memory cells, such as the memory cell 502, the memory cell 504, the memory cell 506, and the memory cell 508, may have a similar configuration. For example, the memory cell 502 may include the TFT 514 coupled to a storage cell 512 that may be a capacitor, which may be called a 1T1C configuration. The memory cell 502 may be controlled through multiple electrical connections to read from the memory cell, write to the memory cell, and/or perform other memory operations. In some embodiments, the storage cell 512 may be another type of storage device, e.g., a resistive random access memory (RRAM) cell.

The TFT 514 may be a selector for the memory cell 502. A word line W1 of the memory array 500 may be coupled to a gate electrode 511 of the TFT 514. When the word line W1 is active, the TFT 514 may select the storage cell 512. A source line S1 of the memory array 500 may be coupled to an electrode 501 of the storage cell 512, while another electrode 507 of the storage cell 512 may be shared with the TFT 514. In addition, a bit line B1 of the memory array 500 may be coupled to another electrode, e.g., an electrode 509 of the TFT 514. The shared electrode 507 may be a source electrode or a drain electrode of the TFT 514, while the electrode 509 may be a drain electrode or a source electrode of the TFT 514. A drain electrode and a source electrode may be used interchangeably herein. Additionally, a source line and a bit line may be used interchangeably herein.

In various embodiments, the memory cells and the transistors, e.g., the memory cell 502 and the TFT 514, included in the memory array 500 may be formed in BEOL, as shown in FIG. 4. For example, the TFT 514 may be illustrated as the vertical TFT 450 shown in FIG. 4 at the BEOL. Accordingly, the memory array 500 may be formed in higher metal layers, e.g., metal layer 3 and/or metal layer 4, of the integrated circuit above the active substrate region, and may not occupy the active substrate area that is occupied by conventional transistors or memory devices.

Figure 6:
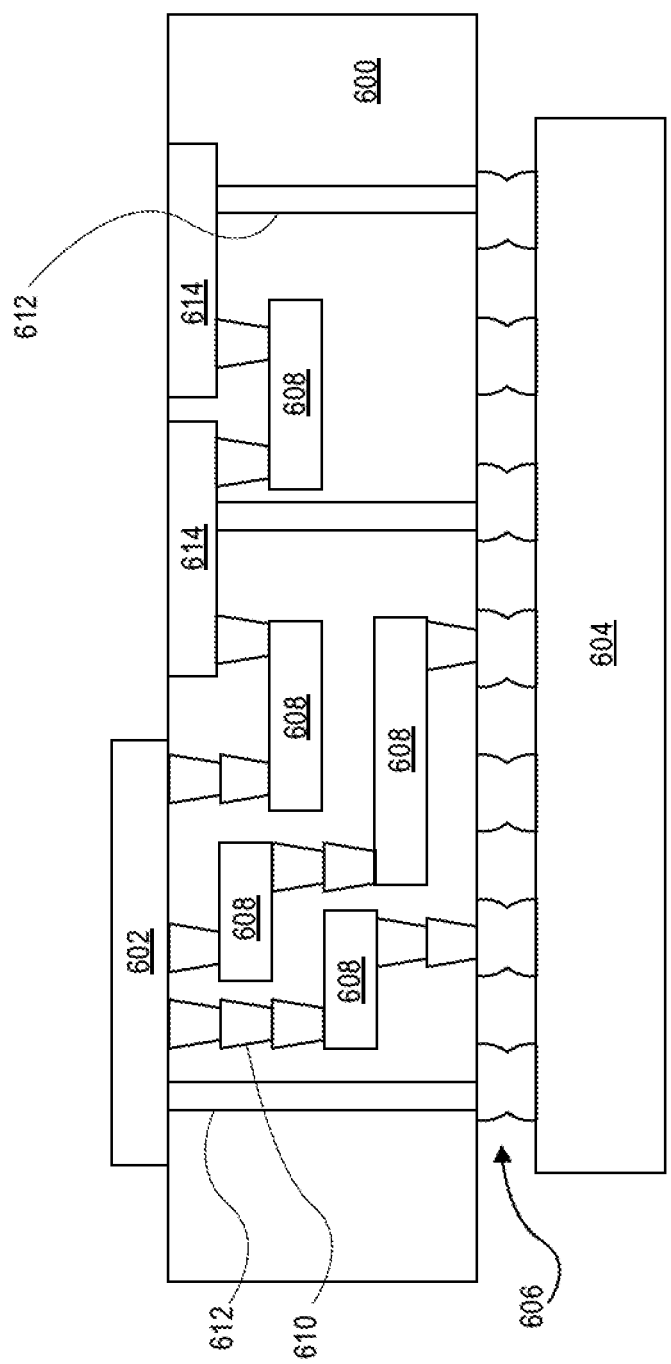
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, a substrate support for a TFT, e.g., the TFT 150 in FIGS. 1(a)-1(d), the TFT 450 in FIG. 4, or a TFT formed following the process 200 shown in FIG. 2. The second substrate 604 may be, for instance, a memory module, a computer motherboard, or another integrated circuit die. For example, the second substrate 604 may be a memory module including the memory array 500 as shown in FIG. 5.

Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
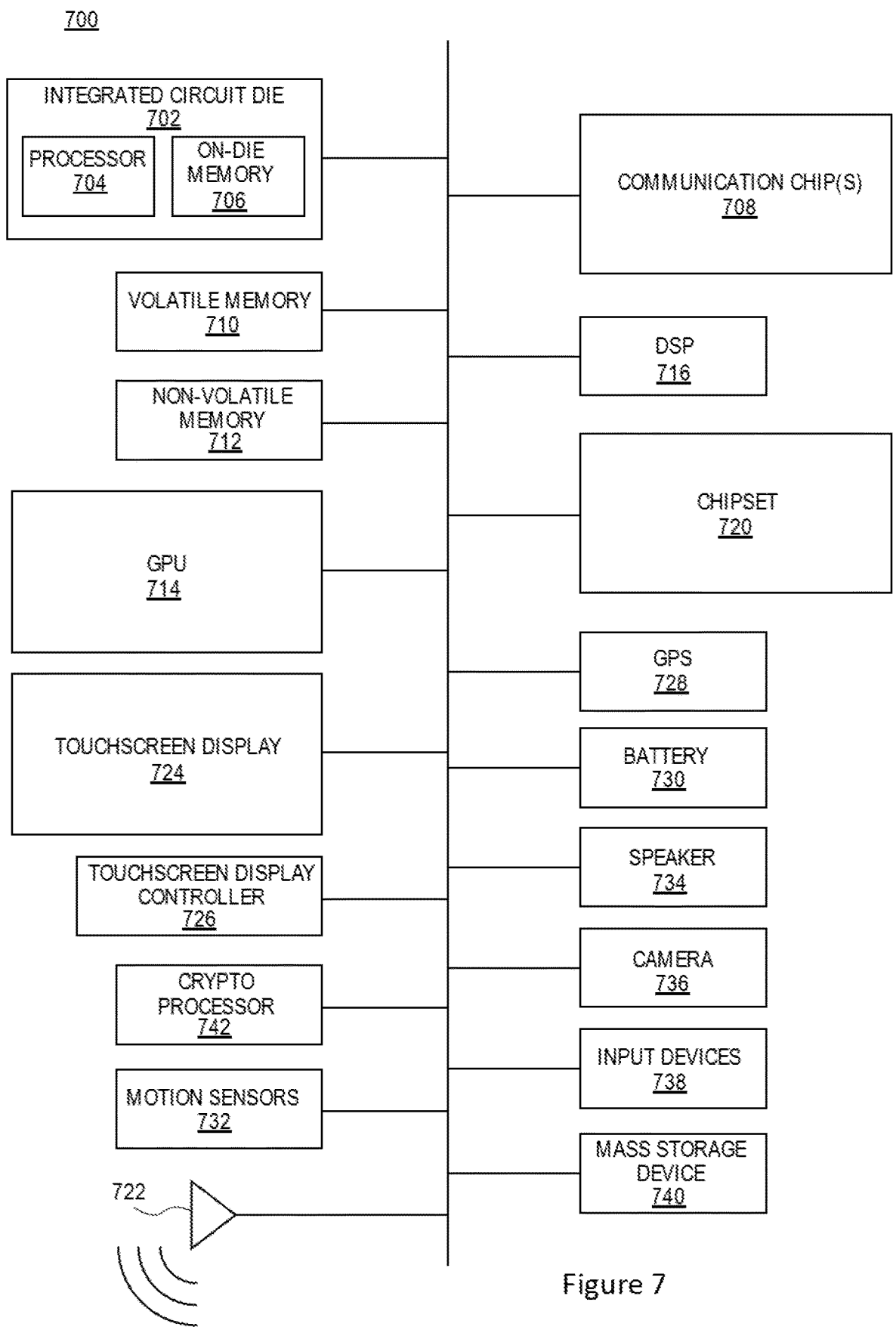
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include the TFT 150 in FIGS. 1(a)-1(d), the TFT 450 in FIG. 4, or a TFT formed following the process 200 shown in FIG. 2.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (μLED) display, or others. For example, the touchscreen display 724 may include the vertical TFT 110 shown in FIG. 1(c), the vertical TFT 350 shown in FIG. 3(d), the vertical TFT 450 shown in FIG. 4, or a vertical TFT formed according to the process 200 shown in FIG. 2.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as DRAM, that are formed in accordance with implementations of the current disclosure, e.g., the TFT 150 in FIGS. 1(a)-1(d), the TFT 450 in FIG. 4, or a TFT formed following the process 200 shown in FIG. 2.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include a semiconductor device, comprising: a substrate oriented in a horizontal direction; a transistor above the substrate, wherein the transistor includes: a source electrode above the substrate, oriented in the horizontal direction; a channel layer including a channel material above and in contact with a portion of the source electrode, the channel layer oriented in a vertical direction substantially orthogonal to the horizontal direction; a gate dielectric layer above the source electrode and the channel layer, conformingly covering a top surface of the source electrode and surfaces of the channel layer; a gate electrode above a portion of the channel layer, conformingly covering a portion of the gate dielectric layer, and separated from the channel layer by the gate dielectric layer; and a drain electrode above and in contact with the channel layer, oriented in the horizontal direction, wherein a current path is to include a vertical current portion from the source electrode along a gated region of the channel layer under the gate electrode in the vertical direction, and a horizontal current portion along an ungated region of the channel layer in the horizontal direction from the gate electrode to the drain electrode.

Example 2 may include the semiconductor device of example 1 and/or some other examples herein, wherein the channel layer is of a rectangular prism shape, and the gate electrode includes a horizontal portion above a top surface of the channel layer, and two vertical portions along sidewalls of the channel layer.

Example 3 may include the semiconductor device of example 1 and/or some other examples herein, wherein the drain electrode is separated from the gate electrode by a spacer between the drain electrode and the gate electrode.

Example 4 may include the semiconductor device of example 1 and/or some other examples herein, wherein the drain electrode is a first drain electrode, and the transistor further includes a second drain electrode above and in contact with the channel layer, oriented in the horizontal direction, wherein the current path is to include the vertical current portion from the source electrode along the gated region of the channel layer under the gate electrode in the vertical direction, a first horizontal current portion along a first ungated region of the channel layer in the horizontal direction from the gate electrode to the first drain electrode, and a second horizontal current portion along a second ungated region of the channel layer in the horizontal direction from the gate electrode to the second drain electrode.

Example 5 may include the semiconductor device of example 1 and/or some other examples herein, wherein the drain electrode has a first length and a first width, the source electrode has a second length and a second width, the second length is different from the first length, or the second width is different from the first width.

Example 6 may include the semiconductor device of example 1 and/or some other examples herein, wherein the drain electrode includes a first conductive material, and the source electrode includes a second conductive material different from the first conductive material.

Example 7 may include the semiconductor device of example 1 and/or some other examples herein, wherein the source electrode is coupled to a first metal electrode located in a first metal layer, the drain electrode is coupled to a second metal electrode located in a second metal layer, and the second metal layer is separated from the first metal layer by an inter-level dielectric (ILD) layer.

Example 8 may include the semiconductor device of example 7 and/or some other examples herein, wherein the source electrode is coupled by a first short via to the first metal electrode located in the first metal layer, or the drain electrode is coupled by a second short via to the second metal electrode located in the second metal layer.

Example 9 may include the semiconductor device of example 1 and/or some other examples herein, wherein the gate electrode, the channel layer, the source electrode, and the drain electrode are within an ILD layer above the substrate.

Example 10 may include the semiconductor device of example 9 and/or some other examples herein, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

Example 11 may include the semiconductor device of example 1 and/or some other examples herein, wherein the gate dielectric layer includes a high-K dielectric material selected from the group consisting of hafnium silicate, zirconium silicate, hafnium dioxide, zirconium dioxide, aluminum oxide, and nitride hafnium silicate.

Example 12 may include the semiconductor device of example 1 and/or some other examples herein, wherein the substrate includes a silicon substrate, a glass substrate, a metal substrate, or a plastic substrate.

Example 13 may include the semiconductor device of example 1 and/or some other examples herein, wherein the gate electrode, the source electrode, or the drain electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, Ru, TiAlN, HfAlN, or InAlO.

Example 14 may include the semiconductor device of example 1 and/or some other examples herein, wherein the channel layer includes a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 15 may include a method for forming a vertical thin film transistor (TFT), the method comprising: forming a source electrode above a substrate, oriented in a horizontal direction, wherein the substrate is oriented in the horizontal direction; forming a channel layer including a channel material above and in contact with a portion of the source electrode, the channel layer oriented in a vertical direction substantially orthogonal to the horizontal direction; forming a gate dielectric layer above the source electrode and the channel layer, conformingly covering a top surface of the source electrode and surfaces of the channel layer; forming a gate electrode above a portion of the channel layer, conformingly covering a portion of the gate dielectric layer, and separated from the channel layer by the gate dielectric layer; and forming a drain electrode above and in contact with the channel layer, oriented in the horizontal direction, wherein a current path is to include a vertical current portion from the source electrode along a gated region of the channel layer under the gate electrode in the vertical direction, and a horizontal current portion along an ungated region of the channel layer in the horizontal direction from the gate electrode to the drain electrode.

Example 16 may include the method of example 15 and/or some other examples herein, further comprising: forming a spacer between the drain electrode and the gate electrode to separate the drain electrode from the gate electrode.

Example 17 may include the method of example 15 and/or some other examples herein, wherein the drain electrode is a first drain electrode, and the method further includes: forming a second drain electrode above and in contact with the channel layer, oriented in the horizontal direction, wherein the current path is to include the vertical current portion from the source electrode along the gated region of the channel layer under the gate electrode in the vertical direction, a first horizontal current portion along a first ungated region of the channel layer in the horizontal direction from the gate electrode to the first drain electrode, and a second horizontal current portion along a second ungated region of the channel layer in the horizontal direction from the gate electrode to the second drain electrode.

Example 18 may include the method of example 15 and/or some other examples herein, wherein the drain electrode has a first length and a first width, the source electrode has a second length and a second width, the second length is different from the first length, or the second width is different from the first width.

Example 19 may include the method of example 15 and/or some other examples herein, wherein the drain electrode includes a first conductive material, and the source electrode includes a second conductive material different from the first conductive material.

Example 20 may include the method of example 15 and/or some other examples herein, wherein the channel layer includes a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 21 may include a computing device, comprising: a circuit board; and a memory device coupled to the circuit board and including a memory array, wherein the memory array includes a plurality of memory cells, a memory cell of the plurality of memory cells includes a transistor and a storage cell, and wherein the transistor includes: a source electrode above a substrate, oriented in a horizontal direction, and coupled to a bit line of the memory array, wherein the substrate is oriented in the horizontal direction; a channel layer including a channel material above and in contact with a portion of the source electrode, the channel layer oriented in a vertical direction substantially orthogonal to the horizontal direction; a gate dielectric layer above the source electrode and the channel layer, conformingly covering a top surface of the source electrode and surfaces of the channel layer; a gate electrode above a portion of the channel layer, conformingly covering a portion of the gate dielectric layer, and separated from the channel layer by the gate dielectric layer, and wherein the gate electrode is coupled to a word line of the memory array; and a drain electrode above and in contact with the channel layer, oriented in the horizontal direction, wherein a current path is to include a vertical current portion from the source electrode along a gated region of the channel layer under the gate electrode in the vertical direction, and a horizontal current portion along an ungated region of the channel layer in the horizontal direction from the gate electrode to the drain electrode, and the drain electrode is coupled to a first electrode of the storage cell; and the storage cell further includes a second electrode coupled to a source line of the memory array.

Example 22 may include computing device of example 21 and/or some other examples herein, wherein the drain electrode is a first drain electrode, and the transistor further includes a second drain electrode above and in contact with the channel layer, oriented in the horizontal direction, wherein the current path is to include the vertical current portion from the source electrode along the gated region of the channel layer under the gate electrode in the vertical direction, a first horizontal current portion along a first ungated region of the channel layer in the horizontal direction from the gate electrode to the first drain electrode, and a second horizontal current portion along a second ungated region of the channel layer in the horizontal direction from the gate electrode to the second drain electrode.

Example 23 may include computing device of example 21 and/or some other examples herein, wherein the drain electrode has a first length and a first width, the source electrode has a second length and a second width, the second length is different from the first length, or the second width is different from the first width.

Example 24 may include computing device of example 21 and/or some other examples herein, wherein the drain electrode includes a first conductive material, and the source electrode includes a second conductive material different from the first conductive material.

Example 25 may include computing device of example 21 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a substrate oriented in a horizontal direction;
a transistor above the substrate, wherein the transistor includes:
a source electrode above the substrate, oriented in the horizontal direction;
a channel layer including a channel material above and in contact with a portion of the source electrode, the channel layer oriented in a vertical direction substantially orthogonal to the horizontal direction;
a gate dielectric layer above the source electrode and the channel layer, conformingly covering a top surface of the source electrode and surfaces of the channel layer;
a gate electrode above a portion of the channel layer, conformingly covering a portion of the gate dielectric layer, and separated from the channel layer by the gate dielectric layer; and
a drain electrode above and in contact with the channel layer, oriented in the horizontal direction, wherein a current path is to include a vertical current portion from the source electrode along a gated region of the channel layer under the gate electrode in the vertical direction, and a horizontal current portion along an ungated region of the channel layer in the horizontal direction from the gate electrode to the drain electrode.

2. The semiconductor device of claim 1, wherein the channel layer is of a rectangular prism shape, and the gate electrode includes a horizontal portion above a top surface of the channel layer, and two vertical portions along sidewalls of the channel layer.

3. The semiconductor device of claim 1, wherein the drain electrode is separated from the gate electrode by a spacer between the drain electrode and the gate electrode.

4. The semiconductor device of claim 1, wherein the drain electrode is a first drain electrode, and the transistor further includes a second drain electrode above and in contact with the channel layer, oriented in the horizontal direction, wherein the current path is to include the vertical current portion from the source electrode along the gated region of the channel layer under the gate electrode in the vertical direction, a first horizontal current portion along a first ungated region of the channel layer in the horizontal direction from the gate electrode to the first drain electrode, and a second horizontal current portion along a second ungated region of the channel layer in the horizontal direction from the gate electrode to the second drain electrode.

5. The semiconductor device of claim 1, wherein the drain electrode has a first length and a first width, the source electrode has a second length and a second width, the second length is different from the first length, or the second width is different from the first width.

6. The semiconductor device of claim 1, wherein the drain electrode includes a first conductive material, and the source electrode includes a second conductive material different from the first conductive material.

7. The semiconductor device of claim 1, wherein the source electrode is coupled to a first metal electrode located in a first metal layer, the drain electrode is coupled to a second metal electrode located in a second metal layer, and the second metal layer is separated from the first metal layer by an inter-level dielectric (ILD) layer.

8. The semiconductor device of claim 7, wherein the source electrode is coupled by a first short via to the first metal electrode located in the first metal layer, or the drain electrode is coupled by a second short via to the second metal electrode located in the second metal layer.

9. The semiconductor device of claim 1, wherein the gate electrode, the channel layer, and the drain electrode are within an ILD layer above the substrate.

10. The semiconductor device of claim 9, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

11. The semiconductor device of claim 1, wherein the gate dielectric layer includes a high-K dielectric material selected from the group consisting of hafnium silicate, zirconium silicate, hafnium dioxide, zirconium dioxide, aluminum oxide, and nitride hafnium silicate.

12. The semiconductor device of claim 1, wherein the substrate includes a silicon substrate, a glass substrate, a metal substrate, or a plastic substrate.

13. The semiconductor device of claim 1, wherein the gate electrode, the source electrode, or the drain electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, Ru, TiAlN, HfAlN, or InAlO.

14. The semiconductor device of claim 1, wherein the channel layer includes a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

\* \* \* \* \*